(12) United States Patent
Ichinoseki

(10) Patent No.: US 9,041,098 B2
(45) Date of Patent: May 26, 2015

(54) SEMICONDUCTOR DEVICE

(71) Applicant: KABUSHIKI KAISHA TOSHIBA, Tokyo (JP)

(72) Inventor: Kentaro Ichinoseki, Hyogo-ken (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 13/938,311

(22) Filed: Jul. 10, 2013

(65) Prior Publication Data
US 2014/0167145 A1 Jun. 19, 2014

(30) Foreign Application Priority Data
Dec. 18, 2012 (JP) ................................ 2012-275699

(51) Int. Cl.
| | |
|---|---|
| H01L 29/76 | (2006.01) |
| H01L 29/78 | (2006.01) |
| H01L 29/66 | (2006.01) |
| H01L 29/40 | (2006.01) |
| H01L 29/423 | (2006.01) |
| H01L 29/739 | (2006.01) |

(52) U.S. Cl.
CPC ...... *H01L 29/7813* (2013.01); *H01L 29/66734* (2013.01); *H01L 29/407* (2013.01); *H01L 29/4236* (2013.01); *H01L 29/66348* (2013.01); *H01L 29/7397* (2013.01)

(58) Field of Classification Search
CPC .................. H01L 29/7813; H01L 29/4236
USPC ................. 257/270, 273, 329, 330, E29.201
See application file for complete search history.

(56) References Cited

U.S. PATENT DOCUMENTS

| | | | |
|---|---|---|---|
| 2009/0283797 A1 | 11/2009 | Takahashi et al. | |
| 2012/0061723 A1 | 3/2012 | Ishii | |
| 2012/0199899 A1 | 8/2012 | Kobayashi et al. | |
| 2013/0137230 A1* | 5/2013 | Blank | 438/270 |

FOREIGN PATENT DOCUMENTS

| | | |
|---|---|---|
| JP | 2011044638 A | 3/2011 |
| JP | 2011199101 A | 10/2011 |
| JP | 2012064641 A | 3/2012 |

* cited by examiner

*Primary Examiner* — Quoc Hoang
(74) *Attorney, Agent, or Firm* — Patterson & Sheridan LLP

(57) ABSTRACT

According to one embodiment, the semiconductor device is provided with a first semiconductor layer, a second semiconductor layer, a third semiconductor layer, a pair of first conductors, a pair of second conductors, first wiring layers, and second wiring layers. Each pair of first and second conductors is formed in first and second trenches via the first and second insulating films and is opposite to the first semiconductor layer and the second semiconductor layer. The first wiring layers have main body parts and plural convex parts. Plural convex parts extend from the main body parts and are electrically connected with the first conductors via a first opening part of a first interlayer insulating film. The second wiring layers are electrically connected with the second conductors via a second opening part of the first interlayer insulating film.

15 Claims, 13 Drawing Sheets

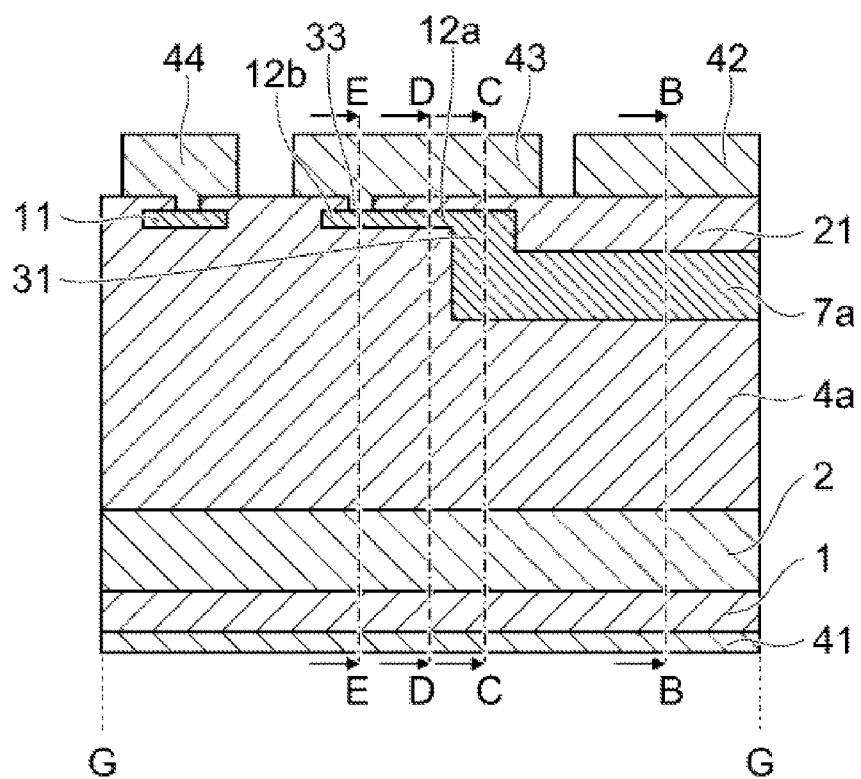
FIG. 8
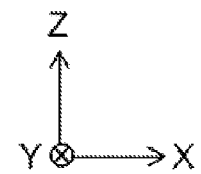

SEMICONDUCTOR DEVICE

CROSS-REFERENCE TO RELATED APPLICATION

This application is based upon and claims the benefit of priority from Japanese Patent Application No. 2012-275699, filed Dec. 18, 2012; the entire contents of which are incorporated herein by reference.

FIELD

Embodiments described herein relate to a semiconductor device.

BACKGROUND

As a semiconductor device, insulated gate-type transistors such as a Metal Oxide Semiconductor Field Effect Transistors (MOSFET) or an Insulated Gate Bipolar Transistors (IGBT) are used. In the semiconductor device, low-power consumption by virtue of a low on-state resistance is required. To realize the low on-state resistance of the MOSFET, a MOSFET having a field plate electrode with a source potential, formed via an insulating film in a trench extending deep into the drift layer, and a gate electrode sandwiched, via an insulating film, between a p-type base layer and the field plate electrode at the upper end of the field plate electrode, has been developed. In the MOSFET, a depletion layer extends into an $n^-$-type drift layer from the adjacent field plate electrodes, thus being able to easily deplete the entire $n^-$-type drift layer. For this reason, in the MOSFET, the on-state resistance can be lowered by raising the n-type impurity concentration of the $n^-$-type drift layer. However, since the field plate electrode with a source potential and the gate electrode with a gate potential are overlapped via the insulating film, the gate-source capacitance is increased. As a result, even if the on-state resistance is lowered, the product (R•C product) of the on-state resistance and the input capacitance as an index of the performance of a semiconductor device is increased.

DESCRIPTION OF THE DRAWINGS

FIG. 8 is a schematic cross section of the portion of the semiconductor device of FIG. 1 sectioned along the G-G line of FIG. 1.

DETAILED DESCRIPTION

Figure 1:
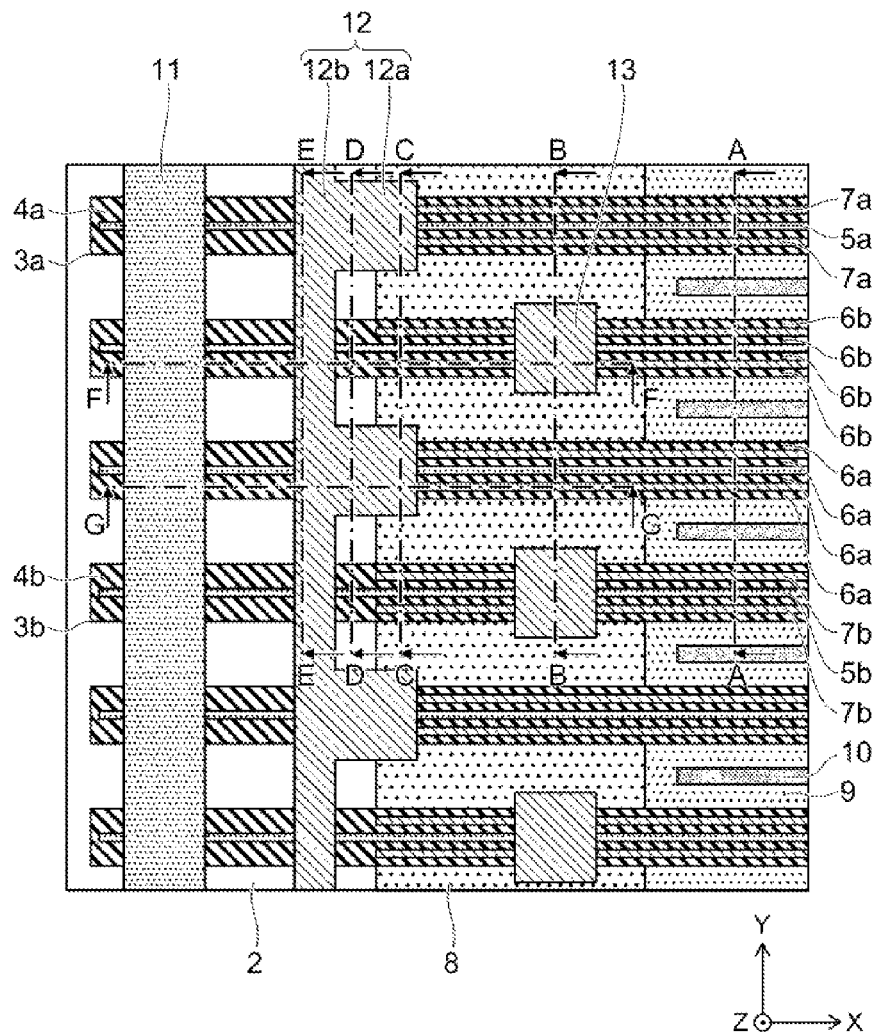
FIG. 1 is a schematic partial plan view of a semiconductor device, showing a portion of the peripheral region and adjacent device regions of a semiconductor device according to a first embodiment.

In general, the embodiments will be explained with reference to the figures. The figures, which are used in the explanation of the embodiments, are schematic to simplify the explanation, and the shape, dimension, size relation, etc., of each element in the figures are not necessarily limited as shown in the figures in an actual application; the dimensions may be appropriately changed in a range wherein the effects of the embodiment can still be obtained. The first conductivity type is explained as an n-type, and the second conductivity type is explained as a p-type. However, these conductivity types can also be explained as their opposite conductivity types. As the semiconductor, silicon is provided as an example; however, compound semiconductors, such as silicon carbide (SiC) and nitride semiconductor (AlGaN), can also be adopted. As the insulating film, silicon oxide is provided as an example; however other insulators, such as silicon nitride, silicon oxynitride, and alumina, may also be used. In case the n-type conductivity type is expressed by $n^+$, n, and $n^-$, an assumption is made that the n-type impurity concentration is highest to lowest in this order. In the p-type, a similar assumption is made that the p-type impurity concentration is highest to lowest in the order of $p^+$, p, and $p^-$.

The semiconductor device according to an embodiment is provided with a first conductivity-type first semiconductor layer, a second conductivity-type second semiconductor layer, a first conductivity-type third semiconductor layer, plural first trenches, plural second trenches, a pair of first conductors, a first field plate electrode, a pair of second conductors, a second field plate electrode, first wiring layers, second wiring layers, a first electrode, a second electrode, and a gate metal. The second conductivity type second semiconductor layer is selectively formed on a first surface of the first semiconductor layer. The second conductivity-type second semiconductor layer is selectively formed on a first surface of the first semiconductor layer. The first conductivity-type third semiconductor layer is selectively formed on the surface of the second semiconductor layer and has a first conductivity-type impurity concentration higher than the impurity concentration of the semiconductor layer. Plural first trenches reach the first semiconductor layer from the surface of the third semiconductor layer, are adjacent to the third semiconductor layer and the second semiconductor layer, extend in a first direction parallel with the first surface of the first semiconductor layer, and are arranged in a second direction that is parallel with the first surface and perpendicular to the first direction. Plural second trenches reach the first semiconductor layer from the first surface, are adjacent to the second semiconductor layer, extend in the first direction, and are arranged among plural first trenches in the second direction. A pair of first conductors is formed in the first trenches via a first insulating film, and the first field plate electrode is formed between a pair of first conductors. A pair of second conductors is formed in the second trenches via a second insulating film. The second field plate electrode is formed between a pair of second conductors. The first wiring layers have main body parts, which are formed on plural first trenches and plural second trenches via a first interlayer insulating film and which extend in the second direction, and plural convex parts, which extend in the first direction from the main body part and are electrically connected with the first conductor via a first opening part of the first interlayer insulating film. The second wiring layer is formed on the second trenches via the first interlayer insulating film and is electrically connected with the second conductor via a second opening part of the first interlayer insulating film. The first electrode is electrically connected to the second surface opposite to the first surface of the first semiconductor layer. The second electrode is electrically connected with the second semiconductor layer, the third semiconductor layer, the second wiring layer, the first field plate electrode, and the second field plate electrode. The gate metal is formed via the second interlayer insulating film on the first wiring layers, is electrically connected to the first wiring layers via a third opening part of the second interlayer insulating film, and applies a gate potential to the first wiring layers.

First Embodiment

Figure 2:
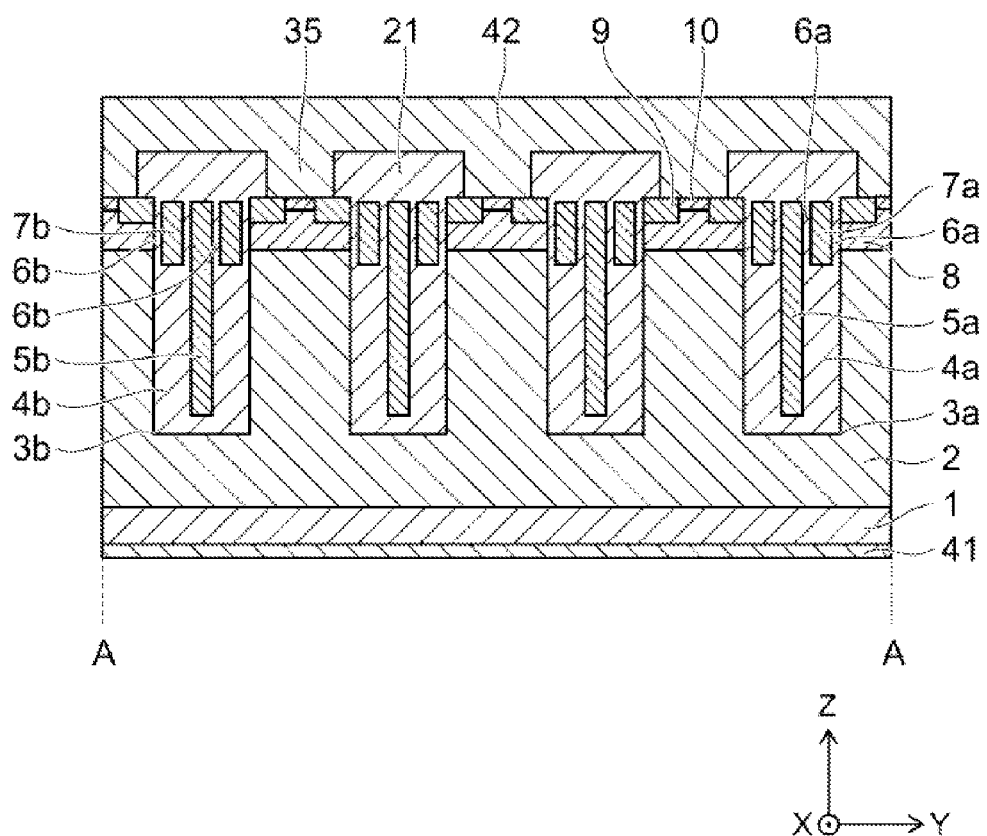
FIG. 2 is a schematic cross section of the portion of the semiconductor device of FIG. 1 sectioned along the A-A line of FIG. 1.
Figure 3:
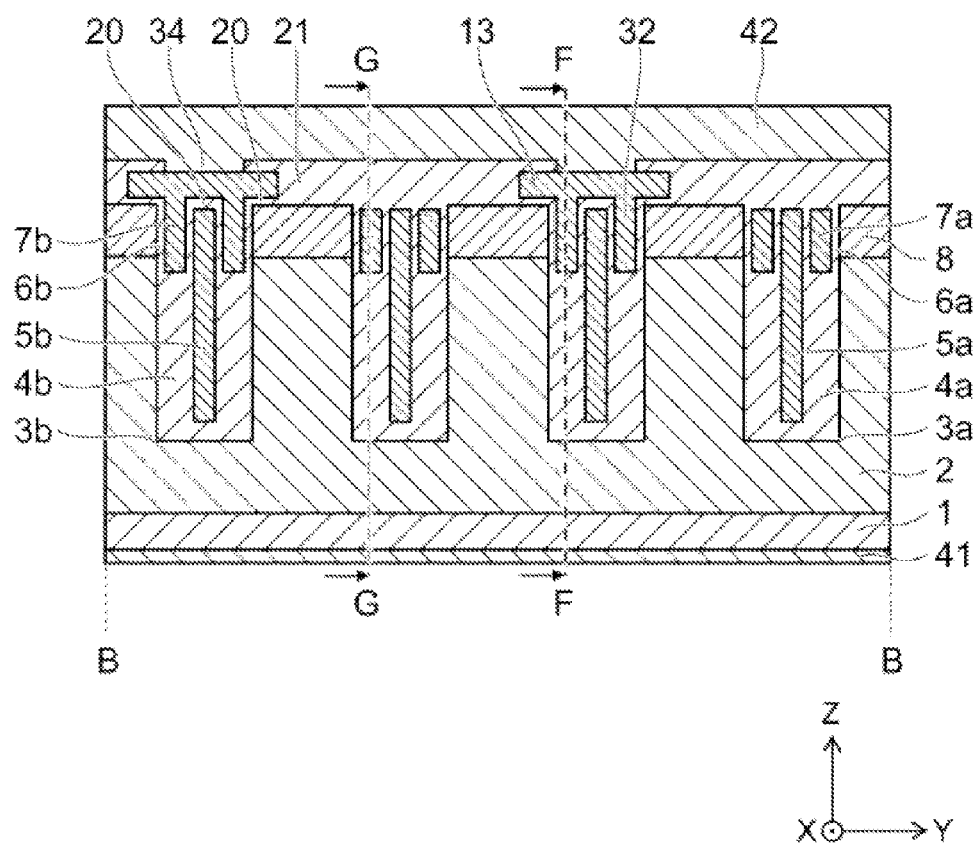
FIG. 3 is a schematic cross section of the portion of the semiconductor device of FIG. 1 sectioned along the B-B line of FIG. 1.
Figure 4:
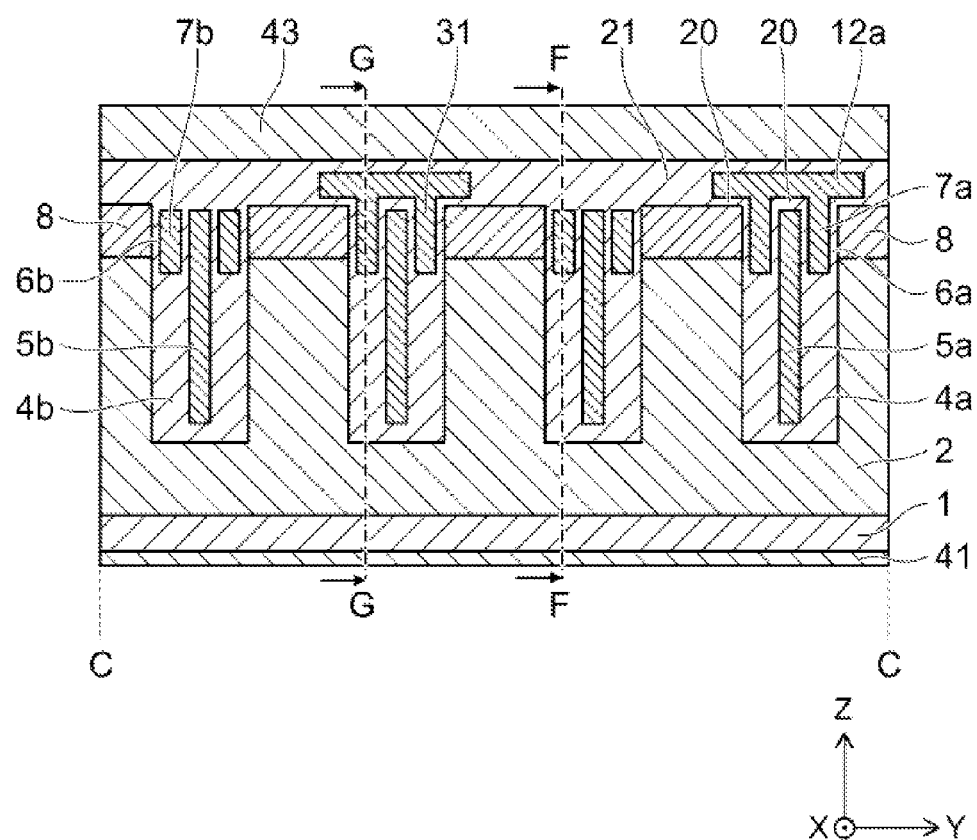
FIG. 4 is a schematic cross section of the portion of the semiconductor device of FIG. 1 sectioned along the C-C line of FIG. 1.
Figure 5:
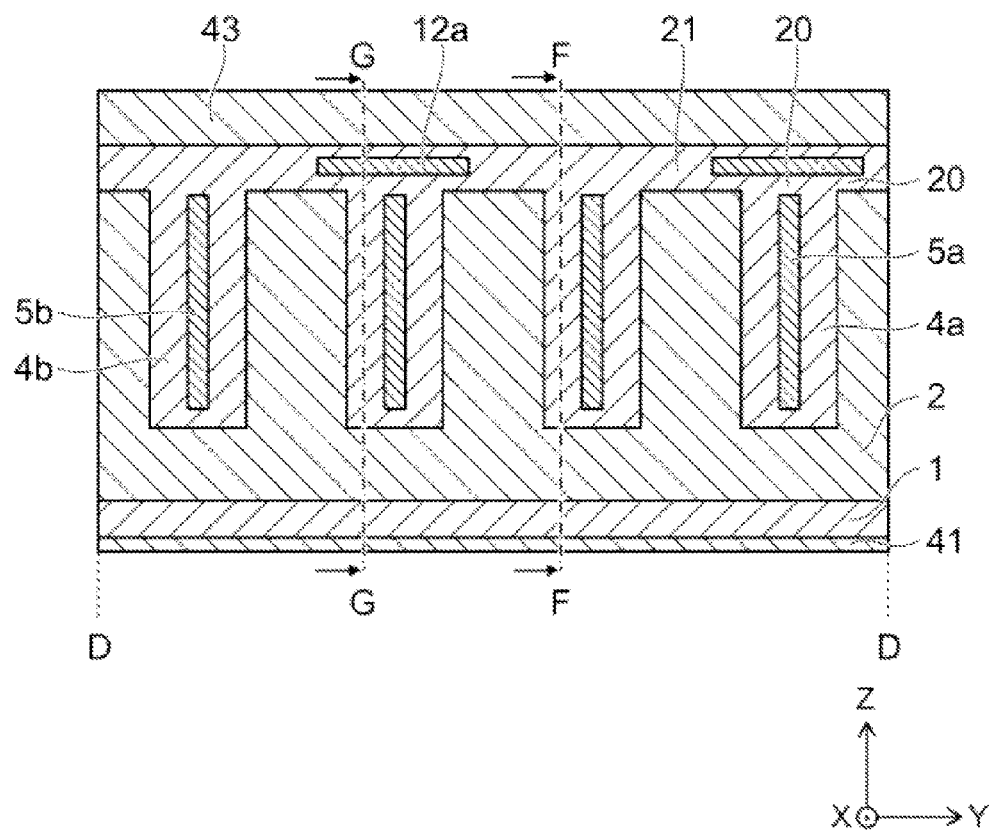
FIG. 5 is a schematic cross section of the portion of the semiconductor device of FIG. 1 sectioned along the D-D line of FIG. 1.
Figure 6:
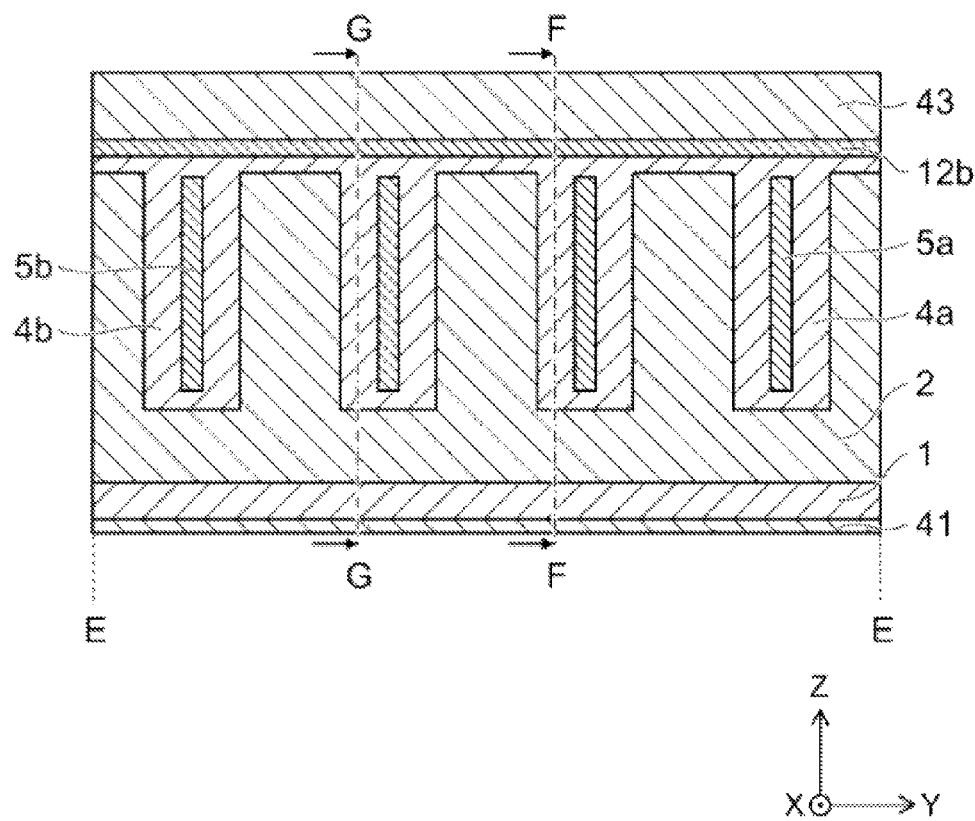
FIG. 6 is a schematic cross section of the portion of the semiconductor device of FIG. 1 sectioned along the E-E line of FIG. 1.
Figure 7:
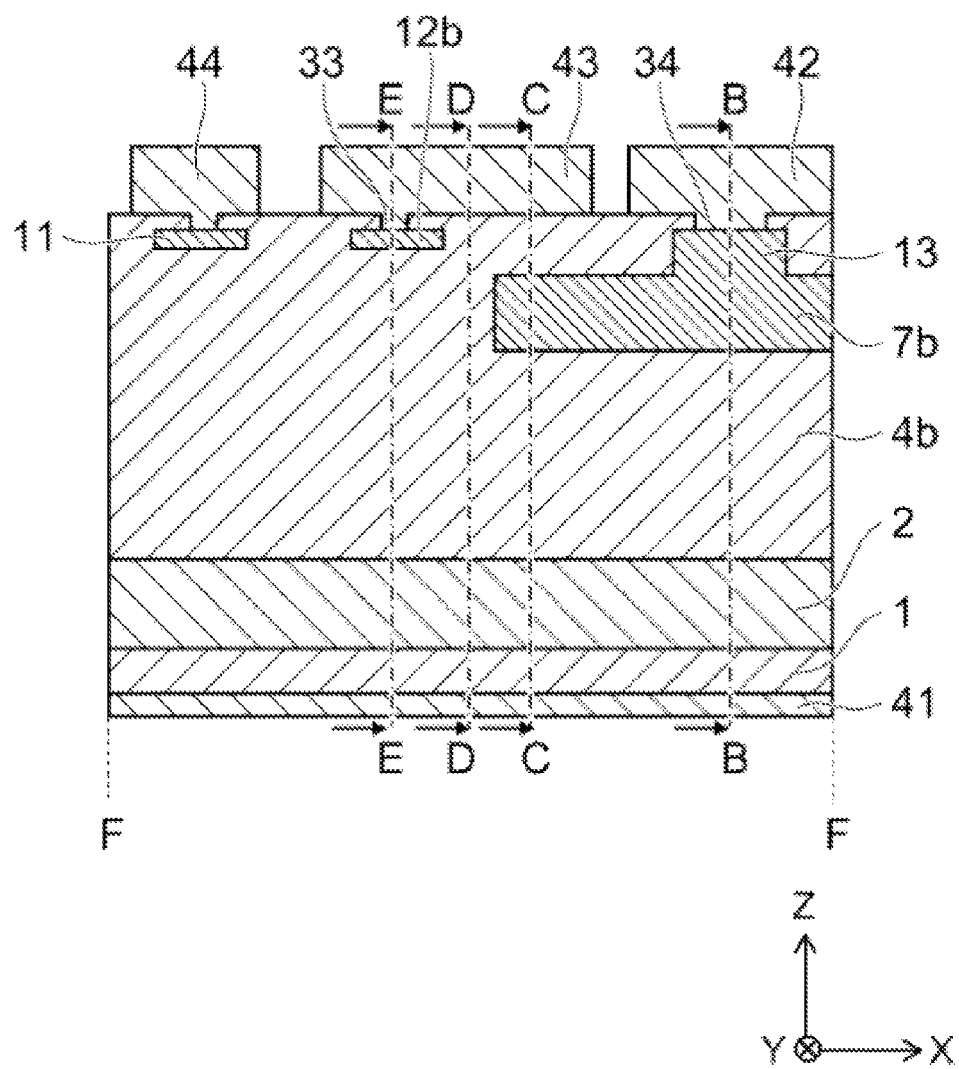
FIG. 7 is a schematic cross section of the portion of the semiconductor device of FIG. 1 sectioned along the F-F line of FIG. 1.

With reference to FIG. 1 to FIG. 8, the semiconductor device according to a first embodiment will be explained. The semiconductor device will be explained using a MOSFET as an example. FIG. 1 is a schematic plan view showing the main parts observed from the top, i.e., a plan view, of a portion of the peripheral region, and adjacent device or active regions, of a MOSFET according to the first embodiment. To simplify the explanation, FIG. 1 shows a MOSFET in which the source electrode 42, a gate metal 43, a source metal 44, a first interlayer insulating film 20, and a second interlayer insulating film 21, which will be described later, are not shown, and the upper surfaces of an n$^+$-type source layer 9 and a p-type base layer 8 are exposed. FIG. 1 shows only one side of the MOSFET device, and only the end portion thereof, it being understood that the device extends to the right in FIG. 1 and is symmetric at an opposite end thereof, and may also extend in the direction of the top and bottom of the FIG. 1 and includes a peripheral region extending around the entire active or device region thereof. FIG. 2 is a schematic cross section along the A-A line of FIG. 1. FIG. 3 is a schematic cross section along the B-B line of FIG. 1. FIG. 4 is a schematic cross section along the C-C line of FIG. 1. FIG. 5 is a schematic cross section along the D-D line of FIG. 1. FIG. 6 is a schematic cross section along the E-E line of FIG. 1. FIG. 7 is a schematic cross section along the F-F line of FIG. 1. FIG. 8 is a schematic cross section along the G-G line of FIG. 1.

The MOSFET according to this embodiment is configured such that the trenches spaced across the device or active region are substantially identically configured, except that the gate electrodes of adjacent trenches are not powered at gate potential, but instead at a lower potential, such as source potential. In this way, the capacitance between adjacent trench regions in the MOSFET it significantly reduced, without sacrificing low resistance of the device in the on state. In this configuration, the MOSFET is provided with an n$^+$-type semiconductor layer (first conductivity-type first semiconductor layer) 1, an n$^-$-type drift layer (first conductivity-type second semiconductor layer) 2, a p-type base layer (second conductivity-type third semiconductor layer) 8, an n$^+$-type source layer (first conductivity-type fourth semiconductor layer) 9, plural first trenches 3a and second trenches 3b, a first field insulating film 4a in the first trenches 3a, a first field plate electrode 5a extending into the first insulating film 4a, a first insulating film 6a at the opening of the first trenches 3a, a pair of first conductors 7a extending into the first insulating film 6a, a second field insulating film 4b in the second trenches 3b, a second field plate electrode 5b extending into the second insulating film 4b, a second insulating film 6b at the opening of the trenches 3b, a pair of second conductors 7b extending into the second insulating film 6b, first wiring layers 12 and second wiring layers 13 extending across the device, a drain electrode (first electrode) 41, a source electrode (second electrode) 42, a gate metal 43, and a source metal 44.

The n$^+$-type semiconductor layer 1 is, for example, a silicon substrate. The n$^-$-type drift layer 2 is formed on the n'-type semiconductor layer 1 and has an n-type impurity concentration lower than the impurity concentration of the n$^+$-type semiconductor layer 1. The n$^-$-type drift layer 2, for example, is an n$^-$-type epitaxial layer epitaxially grown by a CVD method.

The p-type base layer 8 is selectively formed on the surface opposite to the n$^+$-type semiconductor layer 1 of the n$^-$-type drift layer 2. The n$^+$-type source layer 9 is selectively formed on the surface opposite to the n$^+$-type semiconductor layer 1 of the p-type base layer 8 and has an n-type impurity concentration higher than the impurity concentration of the n$^-$-type drift layer 2.

The plural first trenches 3a extend through the n$^+$-type source layer 9 and the p-type base layer 8 which are located one over the other at the upper, i.e., opposed to the n$^+$-type semiconductor layer 1, surface of the n$^-$-type drift layer 2. The first trenches 3a extend into the n$^-$-type drift layer 2 (in the z direction of FIG. 2) and terminate therein and also extend in the X direction (into the page of FIG. 2, along the width or first direction of FIG. 1).

The plural second trenches 3b likewise extend through the n$^+$-type source layer 9 and the p-type base layer 8 which are located one over the other at the upper, i.e., opposed to the n$^+$-type semiconductor layer 1, surface of the n$^-$-type drift layer 2. The second trenches 3b extend inwardly of, and terminate within, the n$^-$-type drift layer 2, and also extend across the device in the X direction as shown in FIG. 1. In addition, the plural second trenches 3b are arranged in an alternating fashion with the plural first trenches 3a in the Y direction of the device as shown in FIG. 1. The first trenches 3a and the second trenches 3b have the same trench shape or outline.

As shown in FIGS. 1 and 2, the first field insulating film 4a covers each bottom face and side surface of the plural first trenches 3a. The first field insulating film 4a, for example, is silicon oxide (SiO$_2$). The first field plate electrode 5a is formed in the first trench within the first field insulating film 4a. The first field plate electrode 5a extends along the first (Z) direction in the first trenches 3a. The first field plate electrode 5a is, for example, conductive polysilicon.

The first insulating film 6a covers the part of the first field plate electrode 5a protruding in the Z direction (the direction perpendicular to the surface of the n$^-$-type drift layer 2) from the first field insulating film 4a, and the inner side surfaces of the first trenches 3a at the upper portions of the first field plate electrode 5a. The first insulating film 6a is made of the same silicon oxide as the silicon oxide of the first field insulating.

Since the first insulating film 6a functions as a gate insulating film, the film is thinner than the first field insulating film 4a film in the gate region of the trench. The first field insulating film 4a and the first insulating film 6a may be formed by thermal oxidation.

A pair of first conductors 7a are formed in the first trenches 3a to either side of the first field plate electrode 5a with the first insulating film 6a extending therebetween, and are spaced from the adjacent sidewalls of the flat trenches 3a by the thinner portions of the first insulating film 6a. The first conductors 7a also extend inwardly of first trenches 3a such that portions thereof are spaced, by the first insulating film 6b, from the n⁻-type drift layer 2, the p-type base layer 8, and the n'-type source layer 9 via the first insulating film 6a. When a gate potential is applied to the first conductors 7a they function as gate electrodes. The first conductors 7a, for example, are made of conductive polysilicon.

As also shown in FIG. 2, a second field insulating film 4b covers the base and side surfaces of the second trenches 3b. The second field insulating film 4b is formed together with the first field insulating film 4a. The second field plate electrode 5b is formed in the second trenches 3b and spaced from the base and sides thereof by the second field insulating film 4b. The second field plate electrode 5b is formed together with the first field plate electrode and has the same three-dimensional shape as the shape of the first field plate electrode 5a. In other words, the dimension of the second field plate electrode 5b in the X direction, the Y direction, and the Z direction is set so that the dimension is the same as the dimension of the first field plate electrode 5a.

The second insulating film 6b, in similar fashion to the first insulating film 6a, covers the part of the second field plate electrode 5b protruding from the second field insulating film 4b and the inner side surface of the second trenches 3b. Since the second insulating film 6b is integrally formed with the first insulating film 6a, the thickness of the second insulating film is the same as the thickness of the first insulating film 6a. In other words, this insulating film is thinner than the second field insulating film 4b in the second conductors 7b region of the trench.

The second conductors 7b, similarly to the pair of first conductors 7a, are formed in the second trenches 3b to either side of the second field plate electrode 5b with the second insulating film 6b extending therebetween, and also extending between the second conductors 7b and the adjacent side walls of the second trenches 3b; the second conductors 7b extend inwardly of second trenches 3b such that portions thereof are spaced, by the second insulating film 6b, from the n⁻-type drift layer 2, the p-type base layer 8, and the n⁺-type source layer 9 via the second insulating film 4b. A pair of second conductors 7b are integrally formed with the pair of first conductors 7a and have the same three-dimensional shape as the shape of the first conductors 7a. In other words, the dimension of a pair of second conductors 7b in the X direction, the Y direction, and the Z direction is set so that their dimension is the same as the dimension of the pair of first conductors 7a.

Between the first trench 3a and the second trench 3b, a p⁺-type contact layer 10 extends into the p-type base layer 8 from a location adjacent to the upper surface of the n⁺-type source layer 9 along the Z direction and is electrically connected with the p-type base layer 8. An area where the n⁺-type source layer 9 is selectively formed on the surface of the p-type base layer 8, as described later, is an element region in which current flows from the drain layer electrode 41 toward the source electrode 42. The area that is outside of this in the X direction is a terminal region in which no current flows in the vertical direction.

Referring again to FIG. 1, the first field plate electrode 5a and the second field plate electrode 5b extend along the device in the X direction, and extend into the n⁻-type drift layer 2 outside of the p-type base layer 8 to the outer edge of the peripheral region of the device to the left of FIG. 1. The first conductors 7a and the second conductors 7b extend in the X-direction to the direction to the left of FIG. 1 a distance less than the first field plate electrode 5a and the second field plate electrode 5b, but their ends extend outside of the area of the n⁺-type source layer 9 in the X-direction to the left of FIG. 1. Thus, the ends of the first conductors 7a and the second conductors 7b terminate between main body parts 12b of the first wiring layers 12, and the n⁺-type source layer 9.

The first wiring layer has a main body part 12b extending across the MOSFET in the Y direction of FIG. 1, and plural extending tab portions 12a formed contiguously therewith and extending a small distance from the main body part 12b over the features of the first trenches 3a in the X-direction of FIG. 1. The main body part 12b is formed across the plural first trenches 3a and second trenches 3b over the first interlayer insulating film 20 and extend in the Y direction that is parallel with the surface of the n⁻-type drift layer 2 and orthogonal to the X direction. The main body part 12b is positioned, in the X direction of FIG. 1, between the ends of the first field plate electrode 5a and the second field plate electrode 5b and the ends of the first conductors 7a and the second conductors 7b. The first interlayer insulating film 20 (FIG. 3) is, for example, silicon oxide.

As shown in FIG. 1, the plural tabs 12a extend in the X direction from the main body part 12b and are electrically connected with each first conductor 7a in the plural first trenches 3a via a first opening part 31 of the first interlayer insulating film 20 as shown in FIGS. 4 and 8. As shown in FIG. 4, the convex parts 12a of the first wiring layers 12 are electrically connected with the upper ends of the pair of first conductors 7a and extend over and are spaced from the upper ends of the first field plate electrodes 7a by the first interlayer insulating film 20. As shown in FIG. 8, the tabs 12a of the first wiring layers 12 are electrically connected to the end in the X direction of the first conductors 7a. In other words, the first opening part 31 of the first interlayer insulating film 20 is disposed right on one end in the X direction of each of the pair of first conductors 7a.

As shown in FIG. 1. first wiring layers 13 are formed as discrete spaced contacts over the second trenches 3b only. As shown in FIG. 3 and FIG. 7, the second wiring layers 13 are formed on the second trenches 3b overlying a portion of the first interlayer insulating film 20 extending therebetween and are electrically connected with second conductors 7b in the second trenches 3b through a second opening 32 of the first interlayer insulating film 20. The second wiring layers 13 are electrically connected to each upper end of the pair of second conductors 7b and extend over the second conductors, and extend over the upper end of the second field plate electrode 7b with the first interlayer insulating film 20 located therebetween. The second wiring layers 13 are disposed between the tabs 12a of the first wiring layers 12 and the n⁺-type source layer 9 in the X direction. In other words, the second opening 32 of the first interlayer insulating film 20 is disposed right on each of the pair of second conductors 7b between the tabs 12a of the first wiring layers 12 and the n⁺-type source layer 9 in the X direction. The respective second wiring layers 13 are spaced from each other by the adjacent first conductors 7a.

The first conductors 7a, the second conductors 7b, the first wiring layers 12, and the second wiring layers 13 are integrally formed. For example, when the first conductor layer 7a and the second conductor layer 7b are formed in the first trenches 3a and the second trenches 3b, polysilicon is formed before the deposition of the first interlayer insulating film 20 on the whole of the $n^+$-type source layer 9, the p-type base layer 8, and the $n^-$-type drift layer 2, and is patterned by a lithography technique and an etching technique, forming the first wiring layers 12 and the second wiring layers 13 in the above described shape. With this patterning, the first wiring layers 12 are electrically connected to only the first conductors 7a, and the second wiring layers are electrically connected to only the second conductors 7b.

A third wiring layer 11 is formed over the first interlayer insulating film 20 on the $n^-$-type drift layer 2 at a location ward from the first wiring layers in the X direction. The third wiring layer 11 extends in the Y direction and is orthogonal to the first trenches 3a and the second trenches 3b. The third wiring layer is directly electrically connected to the first field plate electrode 5a and the second field plate electrode 5b at their upper terminus from their respective trenches 3a, 3b.

The third wiring layer 11 is made of conductive polysilicon and is integrally formed with the first field plate electrode 5a and the second field plate electrode 5b. When the first field plate electrode 5a and the second field plate electrode 5b are formed in the first trenches 3a and the second trenches 3b, the third wiring layer 11 is formed by patterning the conductive polysilicon formed before depositing the first interlayer insulating film 20, on the entire surface of the $n^-$-type drift layer 2, the p-type base layer 8, and the $n^+$-type source layer 9 similar to the above described step.

Referring again to FIG. 2, the drain electrode 41 is electrically connected with the surface opposite to the $n^-$-type drift layer 2 of the $n^+$-type semiconductor layer 1. The drain electrode 41, for example, is a metal such as copper and aluminum.

The source electrode 42 is formed over, and extends through the second interlayer insulating film 21 to contact the p-type base layer, the $n^+$-type source layer 9, the $p^+$-type contact layer 10, the second wiring layers 13, the first trenches 3a, and the second trenches 3b. The source electrode 42 is electrically connected with the $p^+$-type contact layer 10 and the $n^+$-type source layer 9 via a fifth opening part 35 of the second interlayer insulating film 21. Therefore, the source electrode 42 is electrically connected with the p-type base layer 8 via the $p^+$-type contact layer 10.

As shown in FIG. 3 and FIG. 7, the source electrode 42 is electrically connected with each of the plural second wiring layers 13 via a fourth opening part 34 of the second interlayer insulating film 21. Therefore, a source potential is applied to the second wiring layers. The fourth opening part 34 of the second interlayer insulating film 21 is formed directly on each of the second wiring layers 13.

A gate metal line 43 is connected to the first wiring layers 12 via the second interlayer insulating film 21 and extends along the Y direction. As shown in FIG. 7 and FIG. 8, the gate metal line 43 is electrically connected with the first wiring layers 12 via a third opening part 33 of the second interlayer insulating film formed right on the main body parts 12b of the first wiring layers 12. The gate metal line 43 and the source electrode 42 are separated in the X direction. The gate metal line 43 is electrically connected with a gate pad (not shown in the figures), and a gate potential is applied to the gate metal by the gate pad.

As shown in FIG. 7 and FIG. 8, a source metal line 44 is connected to the third wiring layer 11 via the second interlayer insulating film 21. The source metal line 44 is electrically connected with the third wiring layer 11 via the opening part of the second interlayer insulating film 21. In addition, the source metal line 44 is electrically connected with the source electrode 42 in an area not shown in the figures. For this reason, a source potential is applied via the third wiring layer 11 to the first field plate electrode 5a and the second field plate electrode 5b. The source metal line 44 is separated from the gate metal line 43 in the X direction.

The source electrode 42, the gate metal line 43, and the source metal line 44 are metals such as copper or aluminum. These metals, for example, are integrally formed by being patterned after the metal films are formed on the entire surface of the second interlayer insulating film.

Next, the operation of the MOSFET according to this embodiment will be explained. Since a gate potential is applied to the first wiring layers 12, the pair of first conductors 7a in the first trenches 3a act as gate electrodes. In other words, if the gate potential exceeds a threshold, channel layers are formed in parts as side walls of the first trenches 3a of the p-type base layer 8 opposite to the first conductors 7a. Here, if a potential positive to the source electrode 42 is applied to the drain electrode 41, electrons are supplied to the $n^-$-type drift layer 2 from the $n^+$-type source layer 9 along the side walls of the first trenches 3a in the p-type base layer 8 via these channel layers. As a result, current flows from the drain electrodes 41 toward the source electrode 42 in the element region.

On the other hand, since a source potential is applied to the second wiring layers 13, the potential of the pair of second conductors 7b in the second trenches 3b is lower than the threshold and thus they are "floating". For this reason, channel layers are not formed in the parts as the side walls of the second trenches 3b of the p-type base layer 8 opposite to the second conductors 7b. For this reason, along with the side walls of the second trenches 3b of the p-type base layer 8, electrons are not supplied to the $n^-$-type drift layer 2 from the $n^+$-type source layer 9.

Next, to explain the advantages of the MOSFET according to this embodiment, this embodiment will be compared with a MOSFET of a comparative example. First, the MOSFET of the comparative example will be explained with reference to FIG. 9 to FIG. 12.

Figure 9:
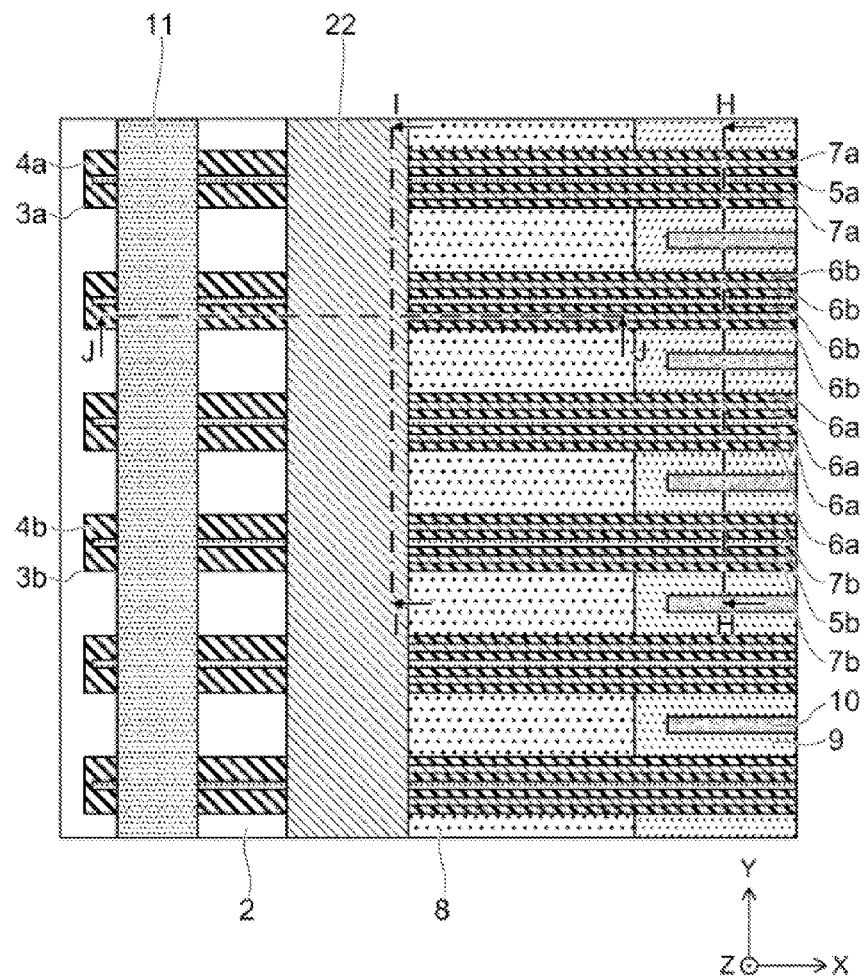
FIG. 9 is a schematic partial plan view of a semiconductor device, showing a portion of the peripheral region and adjacent device regions of a semiconductor device of an embodiment of a comparative example.
Figure 10:
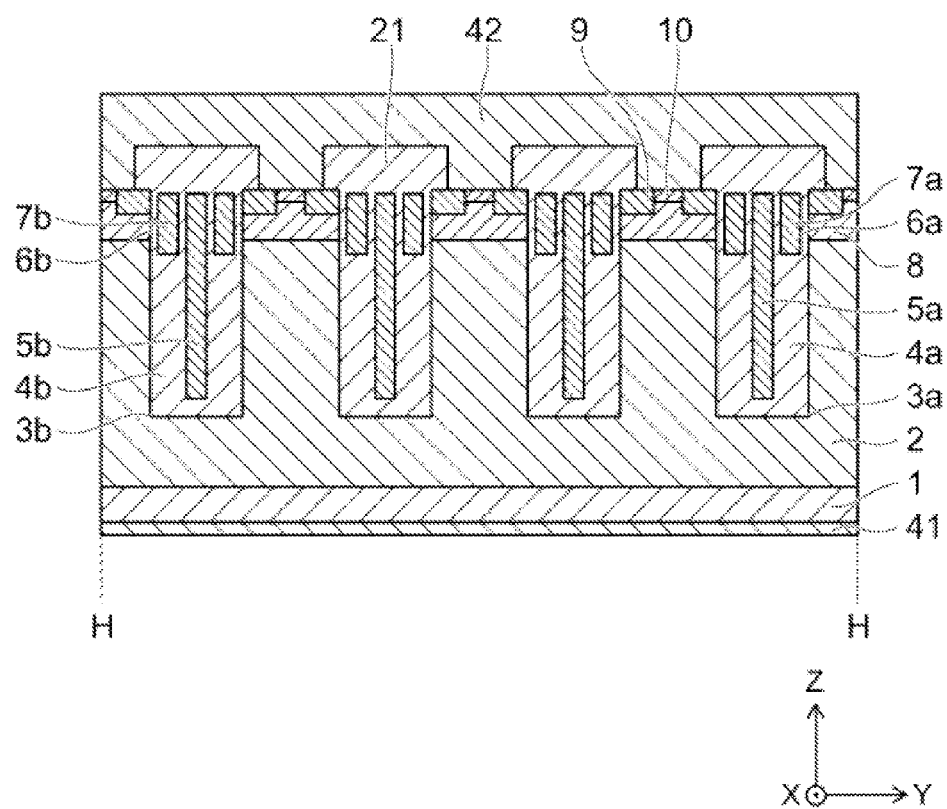
FIG. 10 is a schematic cross section of the portion of the semiconductor device of FIG. 9 sectioned along the H-H line of FIG. 9.
Figure 11:
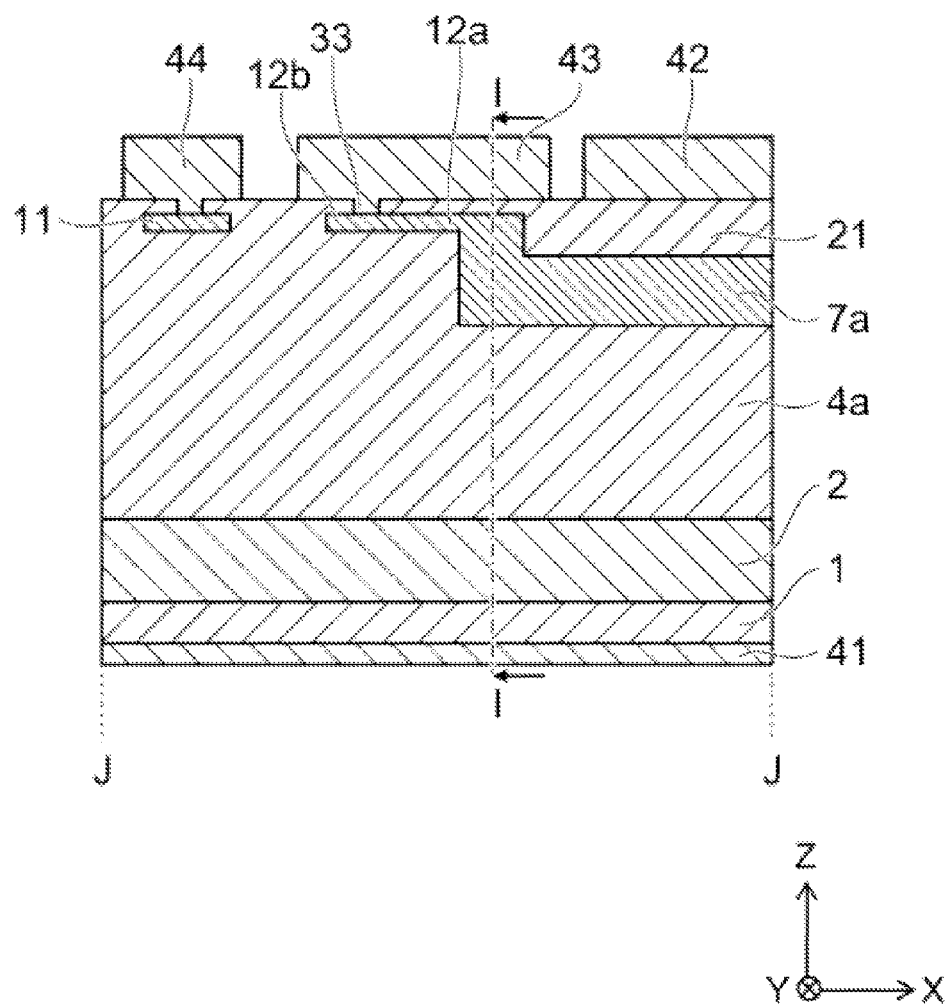
FIG. 11 is a schematic cross section of the portion of the semiconductor device of FIG. 9 sectioned along the J-J line of FIG. 9.
Figure 12:
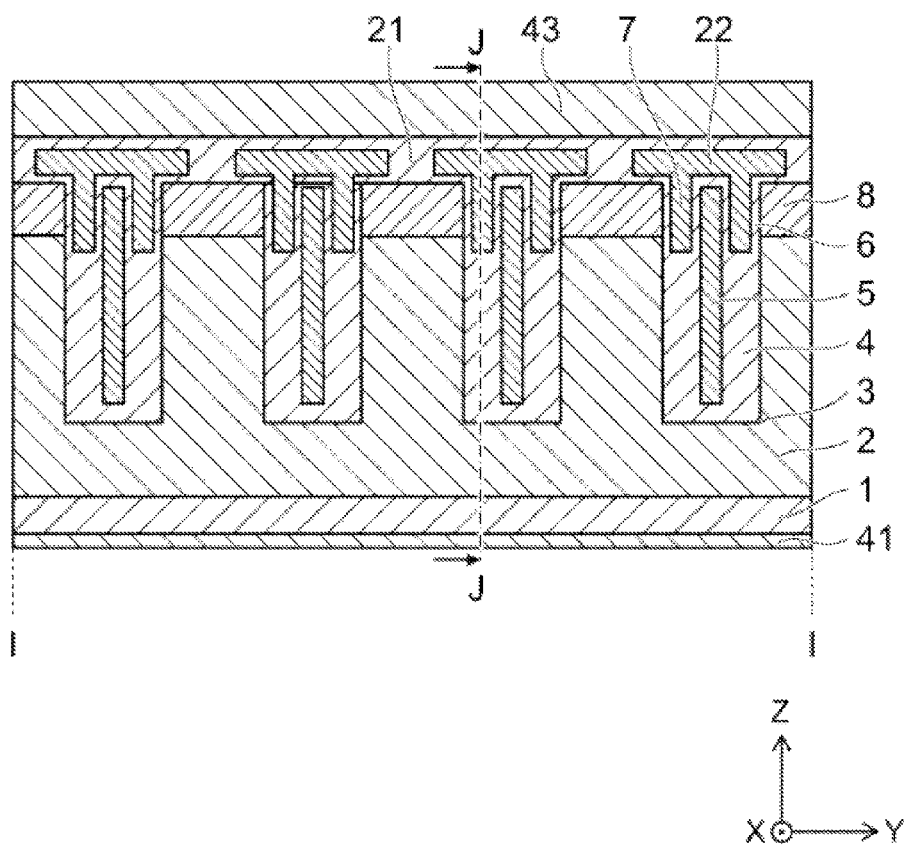
FIG. 12 is a schematic cross section of the portion of the semiconductor device of FIG. 9 sectioned along the I-I line of FIG. 9.

FIG. 9 is a schematic plan view showing the main parts of the MOSFET of the comparative example and corresponds to FIG. 1 showing the MOSFET according to this embodiment. FIG. 10 is a schematic cross section showing the main parts along the H-H line of FIG. 9 and corresponds to FIG. 2 showing the MOSFET according to this embodiment. FIG. 11 is a schematic cross section showing the main parts along the J-J line of FIG. 9 and corresponds to FIG. 7 showing the MOSFET according to this embodiment. FIG. 12 is a schematic cross section showing the main parts along the I-I line of FIG. 9 and corresponds to FIG. 4 showing the MOSFET according to this embodiment.

In the MOSFET of the comparative example, the second wiring layers 13 are combined with the first wiring layers 12 according to the first embodiment to form one first wiring layer 22. In other words, in the MOSFET of the comparative example, the first wirings 12 are electrically connected with both the first conductors 7a and the second conductors 7b. For this reason, in the MOSFET of the comparative example, both the first conductors formed in the first trenches 3a and the second conductors formed in the second trenches 3b will be gate electrodes. Therefore, the first conductors formed in the first trenches 3a and the second conductors formed in the second trenches 3b function as trench-type gate electrodes.

From this point of view, the MOSFET of the comparative example is different from the MOSFET according to the above described embodiment.

In the MOSFET according to this embodiment, the first wiring layers 12 have the main body part 12b and the plural tabs 12a. The main body parts 12b are formed on the plural first trenches 3a and second trenches 3b via apertures in the first insulating film 20 and extend in the Y direction that is parallel with the surface of the n⁻-type drift layer 2 and orthogonal to the X direction. The plural tabs 12a are spaced in the X direction from the main body parts 12b and are electrically connected with the respective first conductors 7a in the plural first trenches 3a via the first opening part 31 of the first interlayer insulating film 20. The first wiring layer 12 is not electrically connected to the second conductors 7b in the second trenches 3b. The first wiring layer 12 has a gate potential.

In addition, the MOSFET according to the above described first embodiment are provided with the second wiring layers 13. The second wiring layers 13 are formed over the second trenches 3b on the first interlayer insulating film 20 and are electrically connected with the second conductors 7b in the second trenches 3b via the second opening part 32 of the first interlayer insulating film 20. The second wiring layers 13 function as a source gate because these wiring layers are electrically connected with the source electrode 42. As a result, in the MOSFET according to this embodiment, the first conductors 7a in the first trenches 3a function as trench-type gate electrodes; however, the second conductors 7b in the second trenches 3b do not function as gate electrodes. The second conductors 7b in the second trenches 3b have a source potential.

In both of the MOSFETs according to this embodiment and the MOSFETs of the comparative example, the first conductors 7a and the first field plate electrode 5a constitute an electrostatic capacitance C1 in the part in which the first insulating film 6a is sandwiched. Similarly, the second conductors 7b and the second field plate electrode 5b constitute an electrostatic capacitance C2 in the part in which the second insulating film 6b is sandwiched.

In the MOSFET according to the comparative example, both of the first conductors 7a in the first trenches 3a and the second conductors 7b in the second trenches 3b have a gate potential. For this reason, both the electrostatic capacitance C1 and the electrostatic capacitance C2 function as a gate-source capacitance. On the contrary, in the MOSFET according to this embodiment, the first conductors 7a in the first trenches 3a have a gate potential; however, the second conductors 7b in the second trenches 3b have a source potential. For this reason, the electrostatic capacitance C1 functions as a gate-source capacitance; however, the electrostatic capacitance C2 functions as an interelectrode capacitance. Therefore, since the MOSFET according to this embodiment has the first wiring layers 12 and the second wiring layers 13, compared with the MOSFET of the comparative example, the gate-source capacitance can be decreased. In other words, in the MOSFET according to the first embodiment, the product of the on-state resistance and the input capacitance can be reduced.

In the MOSFET according to the first embodiment, the first trenches 3a and the second trenches 3b are arranged in an alternate fashion in the Y direction; however, these trenches are not required to be limited to this arrangement. Between the adjacent first trenches 3a, two or more second trenches 3b can also be arranged. In this case, the respective second wiring layers 13 on these two or more second trenches 3b may also be interconnected. Therefore, with the arrangement of two or more second trenches 3b between the adjacent first trenches 3a, the gate-source capacitance of the MOSFET can be further decreased.

Moreover, in the MOSFET according to this embodiment, the second wiring layers 13 are arranged on the second conductors 7b between the tabs 12a of the first wiring layers 12 and the n⁺-type source layer 9 in the X direction. The source electrode 42 is formed on the second wiring layers 13 with the second interlayer insulating film 21 spaced therebetween. The source electrodes 42 are electrically connected with the second wiring layers 13 via the fourth opening part 34 of the second interlayer insulating film 21. With the arrangement of the second wiring layer 13 at the above described positions, the source electrode 42 can be easily and electrically connected to the second wiring layers 13 directly under the source electrode. For this reason, the source electrode 42 can have a simple pattern shape. Furthermore, no special metal wiring layer for connecting the source electrode 42 and the second wiring layers 13 is required to be further formed.

Second Embodiment

Figure 13:
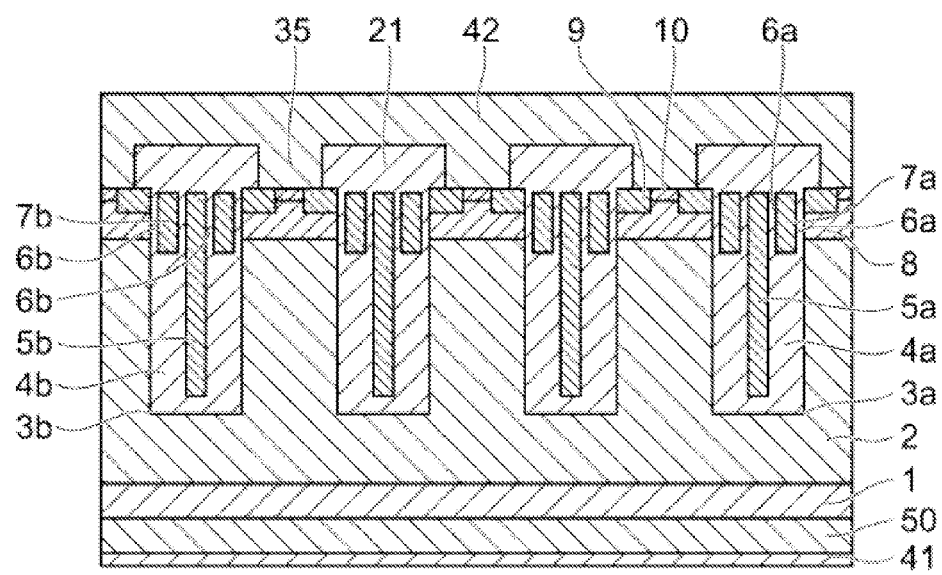
FIG. 13 is a schematic plan view of a portion of a semiconductor device according to a second embodiment.
Figure 13:
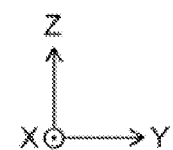

The semiconductor device according to a second embodiment will be explained with reference to FIG. 13. FIG. 13 is a schematic plan view showing a portion of the semiconductor device according to the second embodiment and corresponds to FIG. 2 showing the semiconductor device according to the first embodiment. Here, the same reference numbers or symbols are given to parts with same configuration as the configuration explained in the first embodiment, and their explanation has been omitted. The differences from the first embodiment will be mainly explained.

The semiconductor device according to this embodiment is the case wherein the MOSFET according to the first embodiment is an IGBT. In other words, as shown in FIG. 13, compared with the MOSFET according to the first embodiment, the IGBT according to this embodiment has a p⁺-type collector layer 50 between the n⁺-type semiconductor layer 1 and the drain electrode 41. The p⁺-type collector layer 50 has a p-type impurity concentration higher than the impurity concentration of the p-type base layer 8. Here, in the IGBT, the drain electrode 41 according to the first embodiment functions as a collector electrode 41, and the source electrode 42 functions as an emitter electrode 42.

In the IGBT according to this embodiment, similar to the MOSFET according to the first embodiment, the gate-emitter capacitance can be largely decreased. In addition, the emitter electrode 42 can be easily and electrically connected with the second wiring layers 13 directly under the emitter electrode.

While certain embodiments have been described, these embodiments have been presented by way of example only, and they are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
a first electrode layer;
a drift layer;
a plurality of trenches, spaced from one another, extending into the drift layer, each of the trenches having sidewalls and a base and extending in a first direction in a generally parallel orientation across a portion of the drift layer, at least a portion of the drift layer located between the trenches and the first electrode layer, the trenches further including:
a first insulating film formed therein,
a field plate electrode in the trench, and
a conductor electrode positioned between the field plate electrode and the sidewall of the trench on at least one side of the field plate electrode;
a source layer disposed outwardly of, and adjacent a side wall thereof adjacent the location of a conductor electrode;
a second insulating film overlying the drift layer, the source layer and the trenches;
a second electrode layer extending across the second insulating layer in a second direction, and crossing the plurality of trenches, the second electrode in electrical contact with the conductor electrode of at least a first trench; and
a third electrode layer, extending over and in electrical contact with a conductor electrode in a second trench other than the first trench and which is not in electrical contact with the second electrode layer.

2. The semiconductor device of claim 1, further including n third electrodes, where n is a whole number greater than one, disposed over and in contact with the conductor electrodes of the trenches in which the conductor electrode is not in electrical contact with the second electrode layer.

3. The semiconductor device of claim 2, wherein the conductor electrode in every alternate trench in the second direction is electrically connected to the second electrode layer.

4. The semiconductor device of claim 3, wherein the second conductor in the trenches other than the alternating trenches are electrically connected to the third electrode layer.

5. The semiconductor device of claim 4, wherein the second electrode layer is connectable to a gate potential, and the third conductor is connectable to a potential less than gate potential.

6. The semiconductor device of claim 5, wherein the potential lower than gate potential is source potential.

7. The semiconductor device of claim 2, wherein the second electrode layer is maintained at gate potential and the gate capacitance of the device increases as the number of trenches in which the conductor electrode is connected to the second electrode layer increases.

8. The semiconductor device of claim 2, wherein the trenches include a second conductor electrode located between the field plate electrode and a different sidewall of the trench than that adjacent to the first conductor electrode.

9. The semiconductor device of claim 2, where the third electrode layers are provided as a series of discrete electrode layers located over each trench to which they electrically connect to a second conductor.

10. The semiconductor device of claim 2, wherein the first electrode layer comprises a doped semiconductor.

11. The semiconductor device of claim 10, further including a doped semiconductor collector layer deposited on the first electrode layer opposed to the drift layer and having a dopant of a different conductivity type than a dopant in the first electrode layer.

12. A semiconductor device, comprising:
a first conductivity-type first semiconductor layer;
a second conductivity-type second semiconductor layer selectively formed on a first surface of the first semiconductor layer;
a first conductivity-type third semiconductor layer that is selectively formed on a surface of the second semiconductor layer and has a first conductivity-type impurity concentration higher than an impurity concentration of the first semiconductor layer;
a plurality of first trenches that extend to the first semiconductor layer from a surface of the third semiconductor layer, are adjacent to the third semiconductor layer and the second semiconductor layer, extend in a first direction parallel with the first surface and are arranged in a second direction, which is parallel with the first surface and perpendicular to the first direction;
a plurality of second trenches that extend to the first semiconductor layer from the first surface, are adjacent to the second semiconductor layer, extend in the first direction, and are arranged among the plurality of first trenches in the second direction;
a pair of first conductors formed in the first trenches within a first insulating film;
a first field plate electrode formed between the pair of first conductors;
a pair of second conductors formed in the second trenches via a second insulating film;
a second field plate electrode formed between the pair of second conductors;
first wiring layers having main body parts which are formed on the plurality of first trenches and the plurality of second trenches within a first interlayer insulating film and extend in the second direction, and a plurality of tabs parts that extend in the first direction from the main body parts and are electrically connected with the first conductors at a first opening part of the first interlayer insulating film;
second wiring layers that are formed on the second trenches over the first interlayer insulating film and are electrically connected with the second conductors at a second opening part of the first interlayer insulating film;
a first electrode electrically connected to the second surface opposite to the first surface of the first semiconductor layer;
a second electrode electrically connected with the second semiconductor layer, the third semiconductor layer, the second wiring layers, the first field plate electrode, and the second field plate electrode; and
a gate metal that is formed on a second interlayer insulating film on the first wiring layers, are electrically connected with the first wiring layers at a third opening part of the second interlayer insulating film, and applies a gate potential to the first wiring layers.

13. The semiconductor device according to claim 12, wherein
the first conductors and the second conductors extend along the first direction; and
the ends of the first conductors and the ends of the second conductors respectively exist between the main body parts of the first wiring layers and the fourth semiconductor layer in the first direction.

14. The semiconductor device according to claim 13, wherein
the second wiring layers are formed at the fourth semiconductor layer side from the plurality of tabs of the first wiring layers in the first direction.

15. The semiconductor device according to claim 13, wherein
the second electrode is formed on the second interlayer insulating film on the second wiring layers, the third semiconductor layer, and the fourth semiconductor layer, and is electrically connected with the second wiring layers at a fourth opening part of the second interlayer insulating film, and is electrically connected with the third semiconductor layer and the fourth semiconductor layer at a fifth opening part of the second interlayer insulating film.

* * * * *